(12) United States Patent
Lee

(10) Patent No.: US 6,351,148 B1
(45) Date of Patent: Feb. 26, 2002

(54) BUFFER

(75) Inventor: Chan Yong Lee, Yongin (KR)

(73) Assignee: Samsung Electronics Co., Ltd. (KR)

( * ) Notice: Subject to any disclaimer, the term of this patent is extended or adjusted under 35 U.S.C. 154(b) by 0 days.

(21) Appl. No.: 09/513,712

(22) Filed: Feb. 25, 2000

(30) Foreign Application Priority Data

Sep. 14, 1999 (KR) ............................................. 99-39319

(51) Int. Cl.⁷ ..................... H03K 19/0175; H03K 19/01
(52) U.S. Cl. ........................................... 326/86; 326/17
(58) Field of Search ........................ 326/86–87, 82–83, 326/112, 119, 121, 17; 327/170

(56) References Cited

U.S. PATENT DOCUMENTS

| | | | |
|---|---|---|---|
| 4,749,882 A | * | 6/1988 | Morgan ....................... 327/170 |
| 5,317,206 A | * | 5/1994 | Hanibuchi et al. ............. 326/21 |
| 5,568,081 A | * | 10/1996 | Lui et al. ..................... 327/380 |
| 6,177,819 B1 | * | 1/2001 | Nguyen ....................... 327/112 |

FOREIGN PATENT DOCUMENTS

JP 411355126 A * 12/1999

* cited by examiner

*Primary Examiner*—Michael Tokar
*Assistant Examiner*—James Cho
(74) *Attorney, Agent, or Firm*—Mills & Onello LLP

(57) ABSTRACT

A buffer includes a pull-down means, a pull-up means, and a control signal generator. The pull-down means generates an output signal that transitions to a first state at a relatively high speed when an input signal transitions from a first state to a second state in response to a control signal at a first control state. The pull-up means generates an output signal that transitions to the second state at a relatively high speed when an input signal transitions from the second state to the first state in response to a control signal of a second control state. The control signal generator produces the control signal as a function of the output signal. Accordingly, the buffer can transfer an input signal at a high speed in both cases of a high-to-low transition of the input signal as well as a low-to-high transition of the input signal.

18 Claims, 8 Drawing Sheets

BUFFER

FIELD OF THE INVENTION

The present invention is directed to a buffer, and more particularly, a buffer capable of transferring an input signal at high speed for the case of a high-to-low transition as well as a low-to-high transition.

BACKGROUND OF THE INVENTION

Conventional digital buffers are commonly optimized for fast data transfer during either a high-to-low transition or a low-to-high transition, but not both. Accordingly, when a buffer is optimized for high-speed high-to-low transitions of an input signal, a low-to-high transition in the signal output will occur at a relatively low speed. The inverse is also true—when a buffer is optimized for high-speed low-to-high transitions of an input signal, a high-to-low output signal transition will occur at a relatively low speed.

FIG. 1 is a circuit diagram illustrating an embodiment of a conventional buffer, comprising an inverter I1 which includes a PMOS transistor P1 and an NMOS transistor SN1, and an inverter I2 which includes a PMOS transistor SP1 and an NMOS transistor N1. As shown in FIG. 1, SN1 and SP1 denote small-sized NMOS and PMOS transistors, respectively. The small-sized NMOS transistor SN1 and PMOS transistor SP1 are provided in order to increase the signal output buffering speed in the case of a high-to-low transition of an input signal IN.

FIG. 2 is a timing diagram illustrating an operation of the circuit shown in FIG. 1. The signal output transition time is relatively fast in the case where the input signal IN transitions from a high level to a low level at a high speed (see reference 92). On the contrary, the transition time is relatively slow in case where the input signal IN transitions from a low level to a high level (see reference 94).

FIG. 3 is a circuit diagram illustrating another embodiment of a conventional buffer, comprising an inverter I3 which includes a PMOS transistor SP2 and an NMOS transistor N2, and an inverter I4 which includes a PMOS transistor P2 and an NMOS transistor SN2. As shown in FIG. 3, SN2 and SP2 denote small-sized NMOS and PMOS transistors, respectively. The small-sized NMOS transistor SN2 and PMOS transistor SP2 are provided in order to increase the signal output buffering speed in the case of a low-to-high transition of an input signal IN.

FIG. 4 is a timing diagram explaining an operation of the circuit shown in FIG. 3. The signal output transition time is relatively fast in the case where the input signal IN transitions from a low level to a high level at a high speed (see reference 96). On the contrary, the transition time is relatively slow in case where the input signal IN transitions from a high level to a low level (see reference 98).

In this manner, the conventional buffer is capable of relatively fast signal propagation of the output signal OUT in either case of a low-to-high transition or a high-to-low transition of the input signal IN. However, the conventional buffer is not capable of efficient propagation of both low-to-high and high-to-low transitions of the input signal IN.

SUMMARY OF THE INVENTION

It is an object of the present invention to provide a buffer suitable for increasing speed in generation of a signal output for both cases of a high-to-low transition and a low-to-high transition of an input signal.

In one aspect, the present invention comprises a buffer, comprising a pull-down means for generating an output signal that transitions to a first state when an input signal transitions from a first state to a second state in response to a control signal of a first control state. A pull-up means generates the output signal that transitions to a second state when the input signal transitions from the second state to the first state in response to the control signal being of a second control state. A control signal generator generates the control signal in response to the state of the output signal.

In a preferred embodiment, the pull-down means comprises a first pull-up transistor having a source to which a power supply is applied, and a gate to which the control signal is applied. A second pull-up transistor has a source which is connected to a drain of the first pull-up transistor, a gate to which the input signal is applied, and a drain which generates the output signal. A first pull-down transistor includes a drain which is connected to the drain of the second pull-up transistor, and a gate to which the input signal is applied. A second pull-down transistor includes a drain which is connected to a source of the first pull-down transistor, a gate to which an inverted signal of the control signal is applied, and a source to which a ground voltage is applied, the second pull-up transistor being smaller than the first pull-up transistor and the first and second pull-down transistors.

In another preferred embodiment, wherein the pull-up means comprises a third pull-up transistor having a gate to which the inverted signal of the control signal is applied, and a source to which a power supply is applied. A fourth pull-up transistor includes a source which is connected to the drain of the third pull-up transistor, a gate to which the input signal is applied, and a drain in which the output signal is generated. A third pull-down transistor includes a source which is connected to the drain of the fourth pull-up transistor, and a gate to which the input signal is applied. A fourth pull-down transistor includes a drain which is connected to the source of the third pull-down transistor, a gate to which the control signal is applied, and a source to which a ground voltage is applied, the third pull-down transistor being smaller than the third and fourth pull-up transistors and the fourth pull-down transistor.

In another preferred embodiment, the pull-down means comprises a fifth pull-up transistor having a source to which a power supply is applied, and a gate to which the input signal is applied. A fifth pull-down transistor includes a drain which is connected to a drain of the fifth pull-up transistor, a gate to which the input signal is applied, and a source which is connected to a ground voltage. A first CMOS transfer gate transfers a signal output from the drain of the fifth pull-down transistor as the output signal in response to the control signal being in a first state, the fifth pull-up transistor being smaller than the fifth pull-down transistor.

In another preferred embodiment, the pull-up means comprises a sixth pull-up transistor having a source to which a power supply is applied, and a gate to which the input signal is applied. A sixth pull-down transistor includes a drain which is connected to a drain of the sixth pull-up transistor, a gate to which the input signal is applied, and a source which is connected to a ground voltage. A second CMOS transfer gate transfers a signal output from the drain of the sixth pull-up transistor as the output signal in response to the control signal being in a second control state, the sixth pull-down transistor being smaller than the sixth pull-up transistor.

The control signal generator preferably comprises a first inverter for inverting the output signal of the pull-up or pull-down means. A delay means generates the control signal by delaying an output signal of the first inverter for a predetermined time duration. A second inverter generates the inverted control signal by inverting an output signal of the delay means.

In another aspect, the present invention is directed to a buffer comprising a pull-down means for pulling down an input signal, and for generating an output signal in response to a control signal and an inverted signal of the control signal. A pull-up means pulls-up the input signal and generates the output signal in response to signals with an opposite phase of the control signal and the inverted signal of the control signal. A control signal generator generates the control signal and the inverted signal of the control signal in response to the output signal.

In another aspect, the present invention is directed to a buffer comprising a pull-down means for outputting a pull-down signal which, in response to an input signal undergoing a transition from a low state to a high state, generates an output signal that is pulled down from a high state to a low state, and, in response to an input signal undergoing a transition from a high state to a low state, generates an output signal that is pulled up from a low state to a high state, the pull-down of the output signal occurring at a faster rate than the pull-up of the output signal, the pull-down means being activated in response to a control signal being in a first control state. A pull-up means for outputs a pull-up signal which, in response to an input signal undergoing a transition from a low state to a high state, generates an output signal that is pulled down from a high state to a low state, and, in response to an input signal undergoing a transition from a high state to a low state, generates an output signal that is pulled up from a low state to a high state, the pull-up of the output signal occurring at a faster rate than the pull-down of the output signal, the pull-down means being activated in response to the control signal being in a second control state. A control signal generator generates the control signal as a function of the output signal.

BRIEF DESCRIPTION OF THE DRAWINGS

The foregoing and other objects, features and advantages of the invention will be apparent from the following more particular description of preferred embodiments of the invention, as illustrated in the accompanying drawings in which like reference characters refer to the same parts throughout the different views. The drawings are not necessarily to scale, emphasis instead being placed upon illustrating the principles of the invention.

DETAILED DESCRIPTION OF PREFERRED EMBODIMENTS

Figure 1:
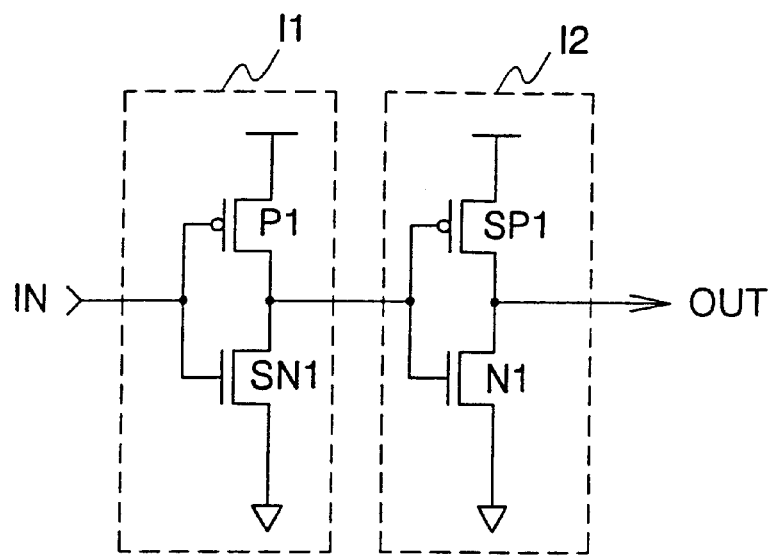
FIG. 1 is a circuit diagram illustrating an embodiment of a conventional buffer.
Figure 2:
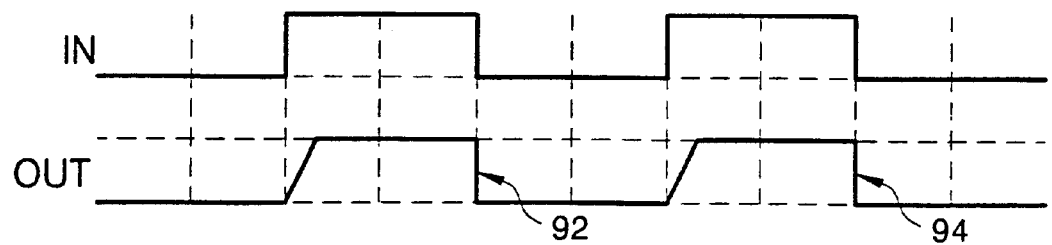
FIG. 2 is a timing diagram illustrating operation of the conventional buffer circuit shown in FIG. 1.
Figure 3:
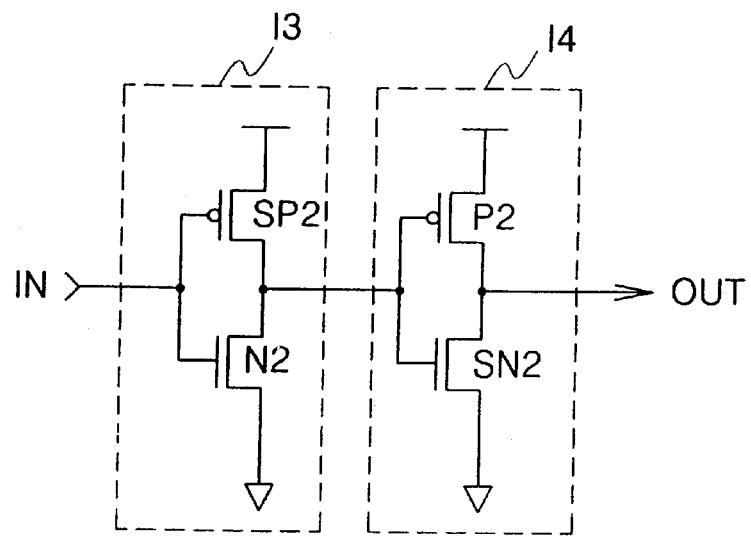
FIG. 3 is a circuit diagram illustrating another embodiment of a conventional buffer.
Figure 4:
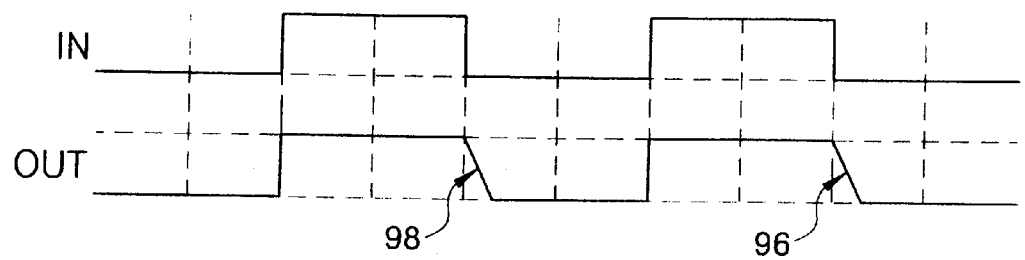
FIG. 4 is a timing diagram explaining operation of the conventional buffer circuit shown in FIG. 3.
Figure 5:
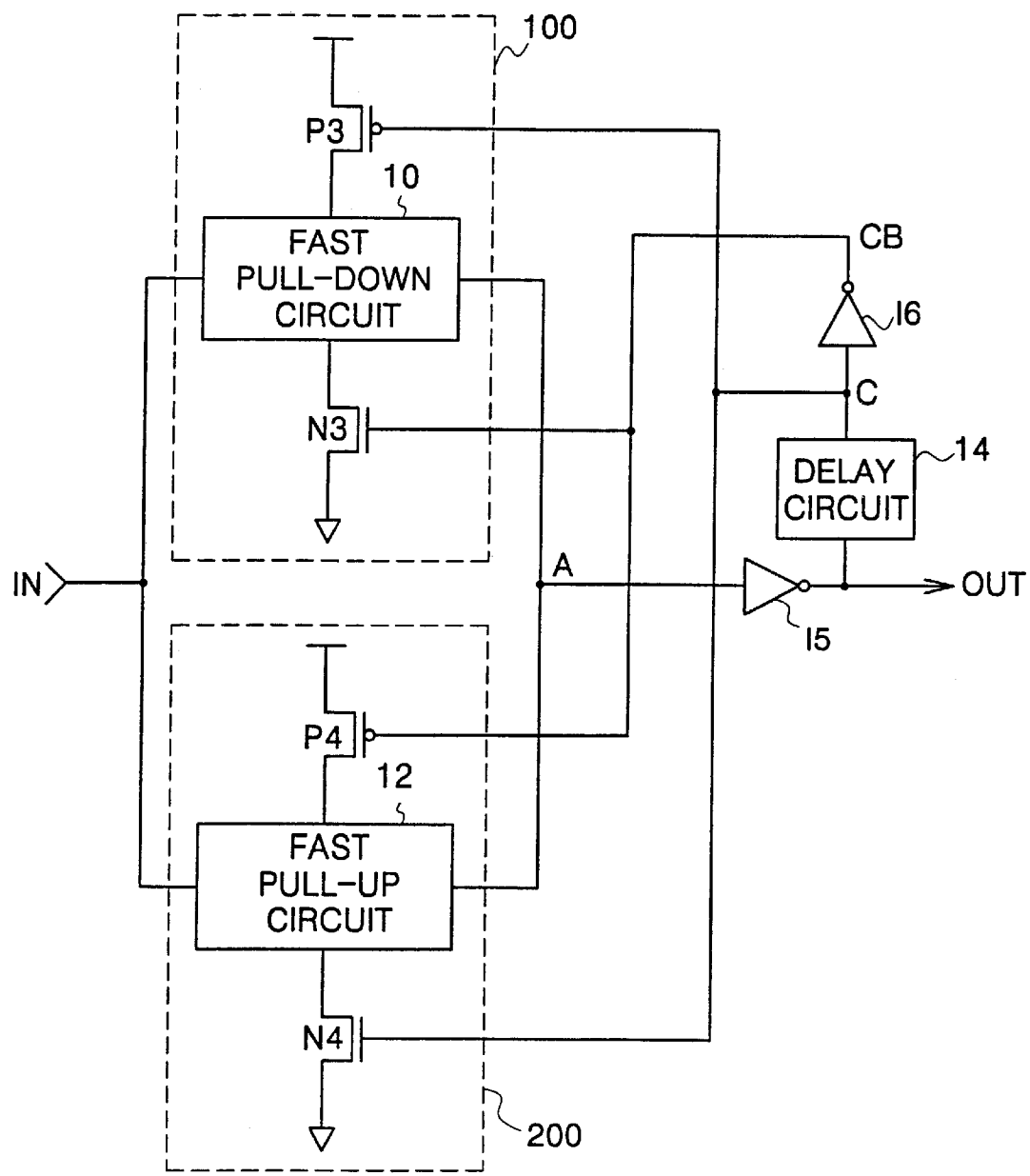
FIG. 5 is a block diagram illustrating an embodiment of a buffer according to the present invention.

FIG. 5 is a block diagram illustrating an embodiment of a buffer according to the present invention. The buffer comprises a fast pull-down means 100, a fast pull-up means 200, invertors 15 and 16 and a delay circuit 14. The fast pull-down means 100 includes a PMOS transistor P3, a fast pull-down circuit 10 and a NMOS transistor N3. The fast pull-up means 200 includes a PMOS transistor P4, a fast pull-up circuit 12 and a NMOS transistor N4.

Operation of the circuit of FIG. 5 will now be described. The PMOS transistor P3 is active low, that is, activated, or turned on, in response to a control signal C at a low level. The NMOS transistor N3 is active high, and is therefore turned on in response to an inverted control signal CB at a high level. The fast pull-down circuit 10 is enabled by activating the PMOS transistor P3 and the NMOS transistor N3 (in response to a control signal C at a LOW level) and rapidly pulls-down an intermediate signal A from a high level to a low level in response to an input signal IN that transitions from a low level to a high level. Similarly, PMOS transistor P4 is active low, and therefore is turned on in response to an inverted control signal CB at a low level. The NMOS transistor N4 is active high, and is turned on in response to a control signal C at a high level. The fast pull-up circuit 12 is enabled by activating the PMOS transistor P4 and the NMOS transistor N4 (in response to a control signal C at a HIGH level) and rapidly pulls-up the intermediate signal A from a low level to a high level in response to an input signal IN that transitions from a high level to a low level. Inverter 15 outputs an output signal OUT by inverting the intermediate signal A of the fast pull-down circuit 10 and the fast pull-up circuit 12. The delay circuit 14 produces the control signal C by delaying the output signal OUT for a predetermined length of time. The control signal C is applied to the gates of the PMOS transistor P3 and the NMOS transistor N4. Inverter 16 generates an inverted control signal CB by inverting the control signal C. The inverted control signal CB is applied to gates of the NMOS transistor N3 and the PMOS transistor P4.

Assuming the output signal OUT to be at a low level from a previous operation, the control signal C and the inverted control signal CB are at a low level and a high level, respectively. Accordingly, the PMOS transistor P3 and NMOS transistor N3, and therefore, the fast pull down circuit 10, are activated. In the embodiment shown, the fast pull-down circuit 10 rapidly pulls down intermediate signal A from a high level to a low level when the input signal IN transitions from a low level to a high level. It follows that if the output signal OUT is at a low level, a previous input signal IN is at a low level. Accordingly, the fast pull-down circuit 10 continues to generate the output signal A at a high level when input signal IN remains at a low level. As soon as the input signal IN transitions to a high level, the fast pull-down circuit 10 is in an active state, and is available to rapidly transition the intermediate signal A from a high level to a low level. During the aforementioned scenario, the fast pull-up circuit 12 is inactive and does not operate.

Assuming the output signal OUT to be at a high level from a previous operation, the control signal C and the inverted control signal CB are at a high level and a low level, respectively. Accordingly, the PMOS transistor P4 and NMOS transistor N4, and therefore, the fast pull up circuit 12, are activated. In the embodiment shown, the fast pull-up circuit 12 rapidly pulls up intermediate signal A from a low level to a high level when the input signal IN transitions from a high level to a low level. It follows that if the output signal OUT is at a high level, a previous input signal IN is at a high level. Accordingly, the fast pull-up circuit 12 continues to generate the output signal A at a low level when input signal IN remains at a high level. As soon as the input signal IN transitions to a low level, the fast pull-up circuit 12 is in an active state, and is available to rapidly transition the intermediate signal A from a low level to a high level. During the aforementioned scenario, the fast pull-down circuit 10 is inactive and does not operate.

In this manner, the circuit configuration of the buffer of the present invention provides for rapid data transition at its output, for both high-to-low and low-to-high input transitions.

Figure 6:
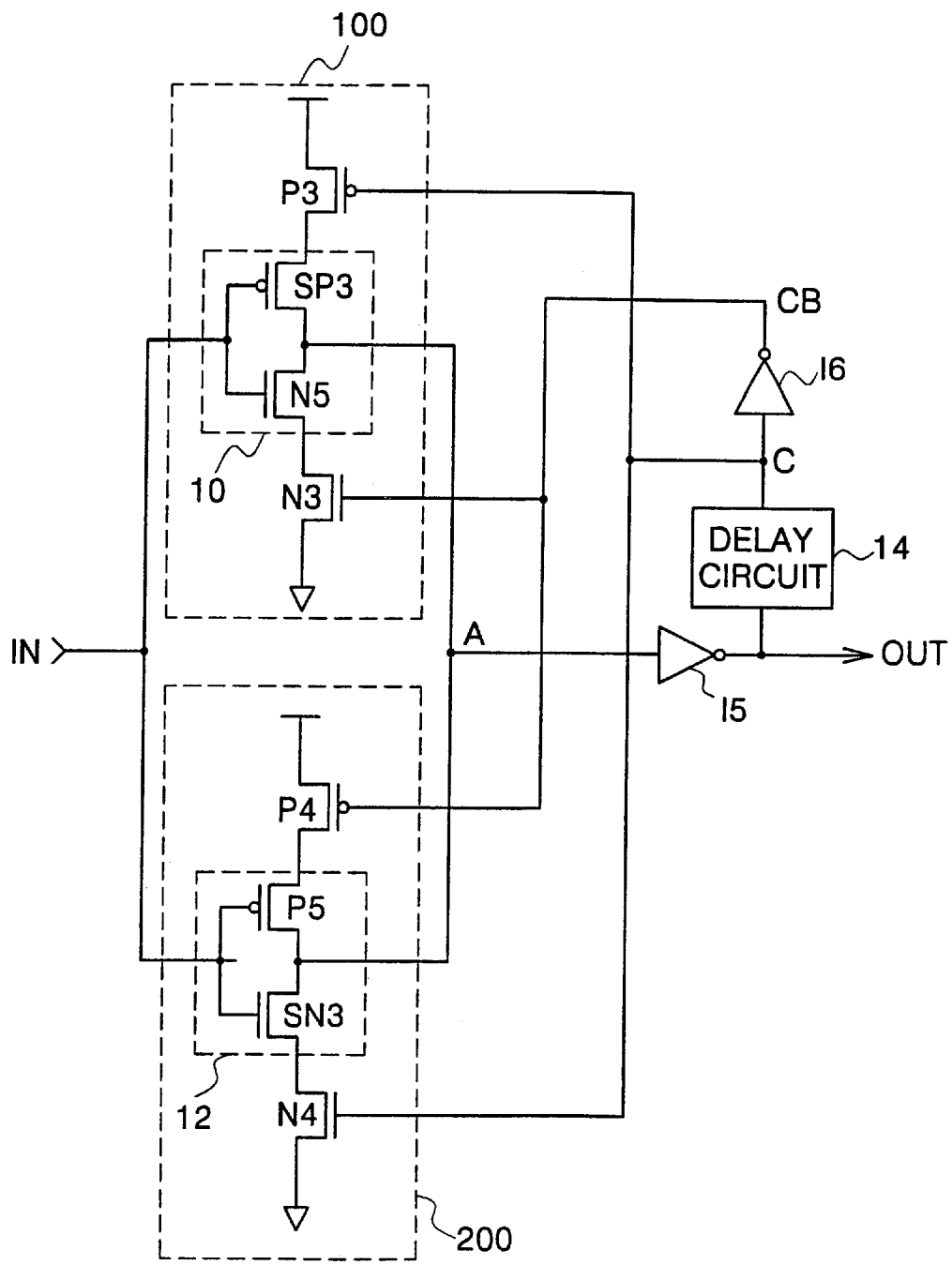
FIG. 6 is a circuit diagram illustrating embodiments of the fast pull-up and fast pull-down circuits of the buffer FIG. 5, in accordance with the present invention.

FIG. 6 is a circuit diagram illustrating the embodiment of FIG. 5, wherein the fast pull-down circuit 10 comprises a PMOS transistor SP3 and a NMOS transistor N5, and the fast pull-up circuit 12 comprises a PMOS transistor P5 and a NMOS transistor SN3. Other components are identical with the configuration illustrated in FIG. 5. In FIG. 6, SN3 and SP3 denote the small-sized NMOS and PMOS transistors, respectively.

The fast pull-down circuit 10 shown in FIG. 6 includes a PMOS transistor SP3 of a small size with respect to the sizes of the PMOS transistor P3 and the NMOS transistors N3 and N5 in order to increase the high-to-low transition speed of the signal output A in the case of a low-to-high transition of the input signal IN. The fast pull-up circuit 12 includes an NMOS transistor N4 of a small size relative to the sizes of the PMOS transistors P4 and P5 and the NMOS transistor N4 in order to increase the low-to-high transition speed of the intermediate signal A in the case of a high-to-low transition of the input signal IN.

Accordingly, the intermediate signal A transition speed in the case of both a high-to-low transition and a low-to-high transition of the input signal IN is relatively fast, since the buffer includes both the fast pull-down circuit 10 and the fast pull-up circuit 12 as shown in FIG. 6.

Figure 7:
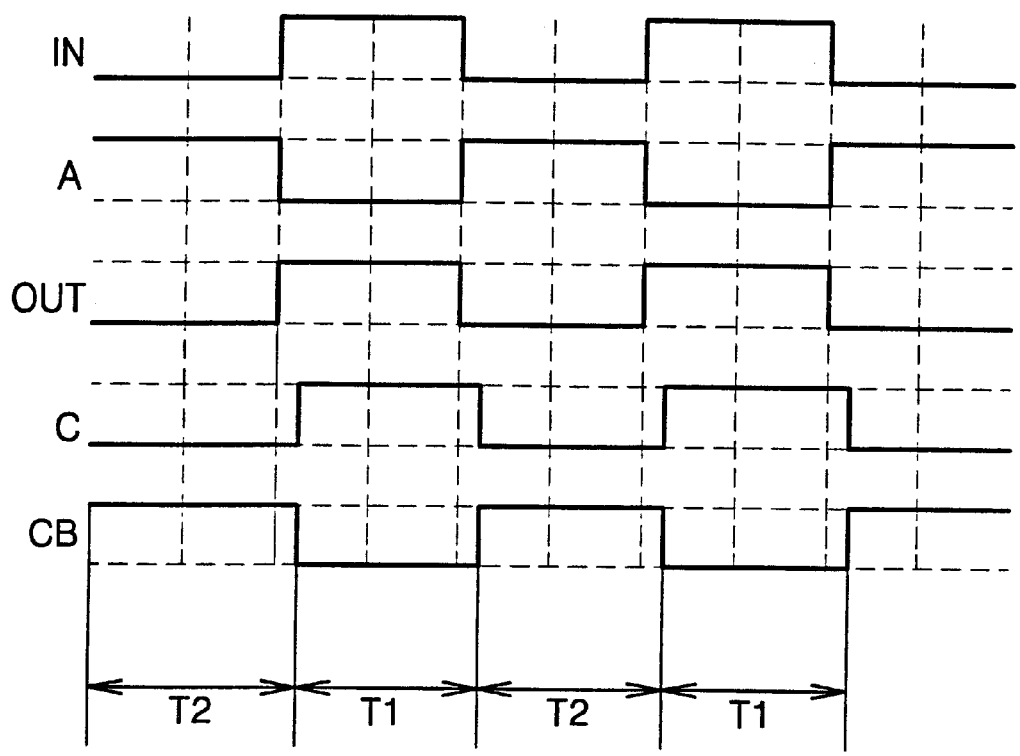
FIG. 7 is a timing diagram explaining operation of the circuit shown in FIG. 6, in accordance with the present invention.

FIG. 7 is a timing diagram explaining the operation of the circuit illustrated in FIG. 6. When the output signal OUT is previously at a low level, the delay circuit 14 receives and delays the output signal OUT for a predetermined time period, and generates the control signal C. The inverter 16 inverts the control signal C and generates an inverted control signal CB at a high level. Accordingly, the PMOS transistor P3 and the NMOS transistor N3 are activated, and their counterpart transistors P4, N4 in the pull-up circuit are deactivated. While the input signal IN is at a low level, the PMOS transistor SP3 is turned on so that the fast pull-down circuit 10 maintains the intermediate signal A at a high level. When the input signal IN transitions to a high level, the NMOS transistor N5 is turned on, and the fast pull-down circuit 10 generates an intermediate signal A which rapidly transitions to a low level at a relatively high speed, and remains low over the time interval of T1.

Similarly, while the output signal OUT is at a high level over the time interval T1, the delay circuit 14 receives and delays the output signal OUT for a predetermined time period, and generates the control signal C at a high level. The inverter 16 inverts the control signal C and generates an inverted control signal CB at a low level. Accordingly, the PMOS transistor P4 and the NMOS transistor N4 are activated, and their counterpart transistors P3, N3 in the fast pull-down circuit 100 are deactivated. While the input signal IN is at a high level, the NMOS transistor SN3 is turned on so that the fast pull-up circuit 10 maintains the intermediate signal A at a low level. When the input signal IN transitions to a low level, the PMOS transistor P5 is turned on, and the fast pull-up circuit 10 generates an intermediate signal A which rapidly transitions to a high level at a relatively high speed, and remains high over the time interval of T2.

Figure 8:
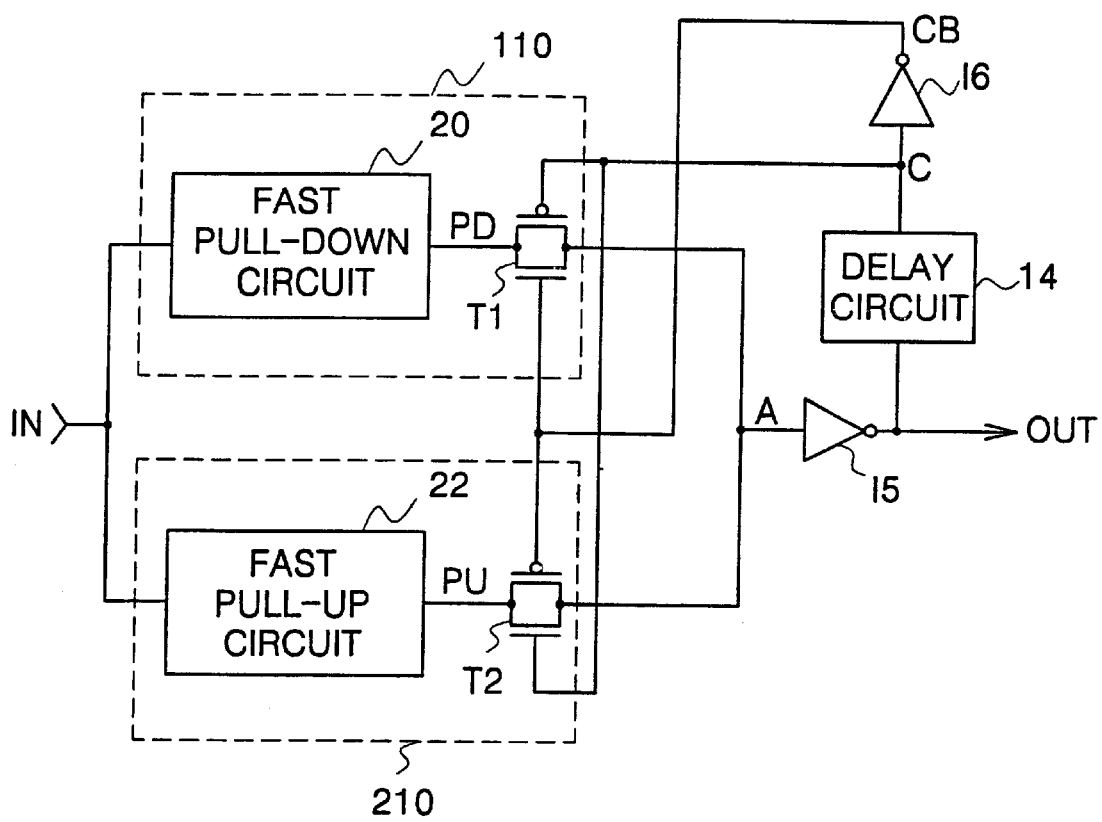
FIG. 8 is a block diagram illustrating another embodiment of a buffer according to the present invention.

FIG. 8 is a block diagram illustrating another embodiment of a buffer according to the present invention, comprising a fast pull-down means 110, a fast pull-up means 210, inverters 15 and 16, and a delay circuit 14. The fast pull-down means 110 includes a fast pull-down circuit 20 and a CMOS transmission gate T1. The fast pull-up means includes a fast pull-up circuit 22 and a CMOS transmission gate T2.

Operation of the circuit illustrated in FIG. 8 will now be described. When the output signal OUT is at a low level, the control signal C and the inverted control signal CB are at a low level and a high level, respectively. Accordingly, the CMOS transmission gate T1 is turned on. The fast pull-down circuit 20 generates an intermediate signal A by transferring a pull-down signal PD through the CMOS transmission gate T1. When the output signal OUT is at a low level, the input signal IN is likewise at a low level. Accordingly, the fast pull-down circuit 20 maintains the pull-down signal PD at a high level while the input signal IN is low. When the input signal IN transitions to a high level, the fast pull-down circuit 20 responds by generating a pull-down signal PD that rapidly transitions to a low level. The CMOS gate T1 passes this low-level pulled-down signal to provide intermediate signal A. The corresponding pull-up signal PU of the fast pull-up circuit 22 is not transmitted since the corresponding CMOS transmission gate T2 is turned off.

While the output signal OUT is at a high level, the inverted control signal CB and the control signal C transition to a low level and a high level, respectively. Accordingly, the CMOS transmission gate T2 is turned on (and T1 is turned off). The fast pull-up circuit 22 generates an intermediate signal A by transferring a pull-up signal PU through the CMOS transmission gate T2. When the output signal OUT is at a high level, the input signal IN is likewise at a high level. Accordingly, the fast pull-up circuit 22 maintains the pull-up signal PU at a low level while the input signal IN is high. When the input signal IN transitions to a low level, the fast pull-up circuit 22 responds by generating a pull-up signal PU that rapidly transitions to a high level. The CMOS gate T2 passes this high-level pulled-up signal to provide intermediate signal A. The corresponding pull-down signal PD of the fast pull-down circuit 20 is not transmitted since the corresponding CMOS transmission gate T1 is turned off.

Figure 9:
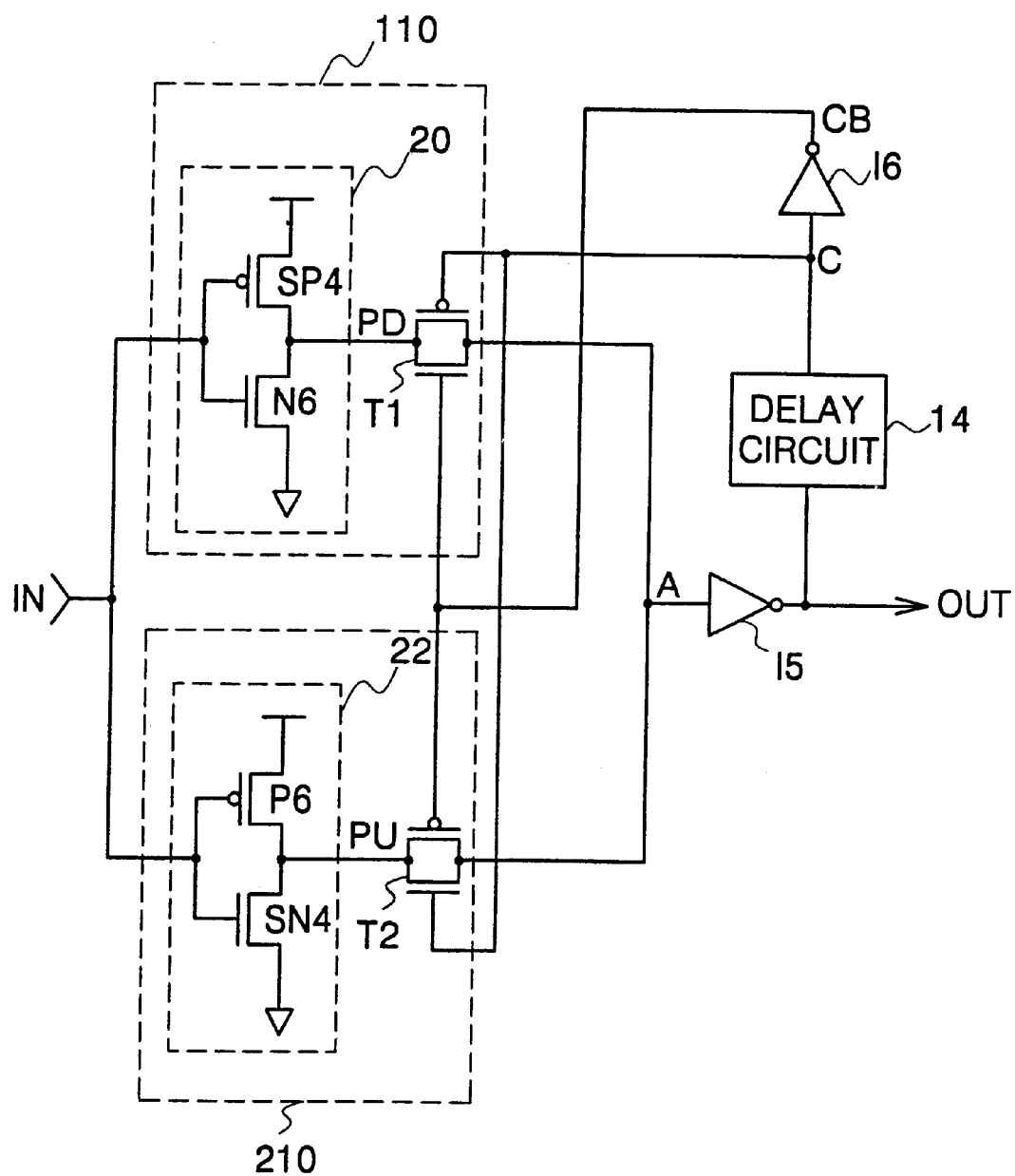
FIG. 9 is a circuit diagram illustrating embodiments of the fast pull-up and fast pull-down circuits of the buffer shown in FIG. 8, in accordance with the present invention.

FIG. 9 is a circuit diagram illustrating the embodiments shown in FIG. 8, wherein the fast pull-down circuit 20 includes a PMOS transistor SP4 and an NMOS transistor N6, and the fast pull-up circuit 22 includes a PMOS transistor P6 and an NMOS transistor SN4. Other components are identical with those shown in the configuration shown in FIG. 8.

In FIG. 9, SP4 and SN4 denote relatively small-sized PMOS and NMOS transistors, respectively, as compared to the sizes of transistors N6 and P6. That is, the fast pull-down circuit 20 includes the PMOS transistor SP4 of a small size relative to the NMOS transistor N6 in order to increase the signal output transition speed in the case of a low-to-high transition of the input signal IN. The fast pull-up circuit 22 includes the NMOS transistor SN4 of a small size relative to the PMOS transistor P6 in order to increase the signal output transition speed in the case of a high-to-low transition of the input signal IN. Accordingly, the signal output transition speed for both high-to-low transitions and a low-to-high transitions of the input signal IN can be relatively fast since the buffer includes both the fast pull-down circuit 20 and the fast pull-up circuit 22. That is, the pull-up signal PU of the fast pull-up circuit 22 is provided as the intermediate signal A when the output signal OUT is at a high level, and the pull-down signal PD of the fast pull-down circuit 20 is output as the intermediate signal A when the output signal OUT is at a low level.

Figure 10:
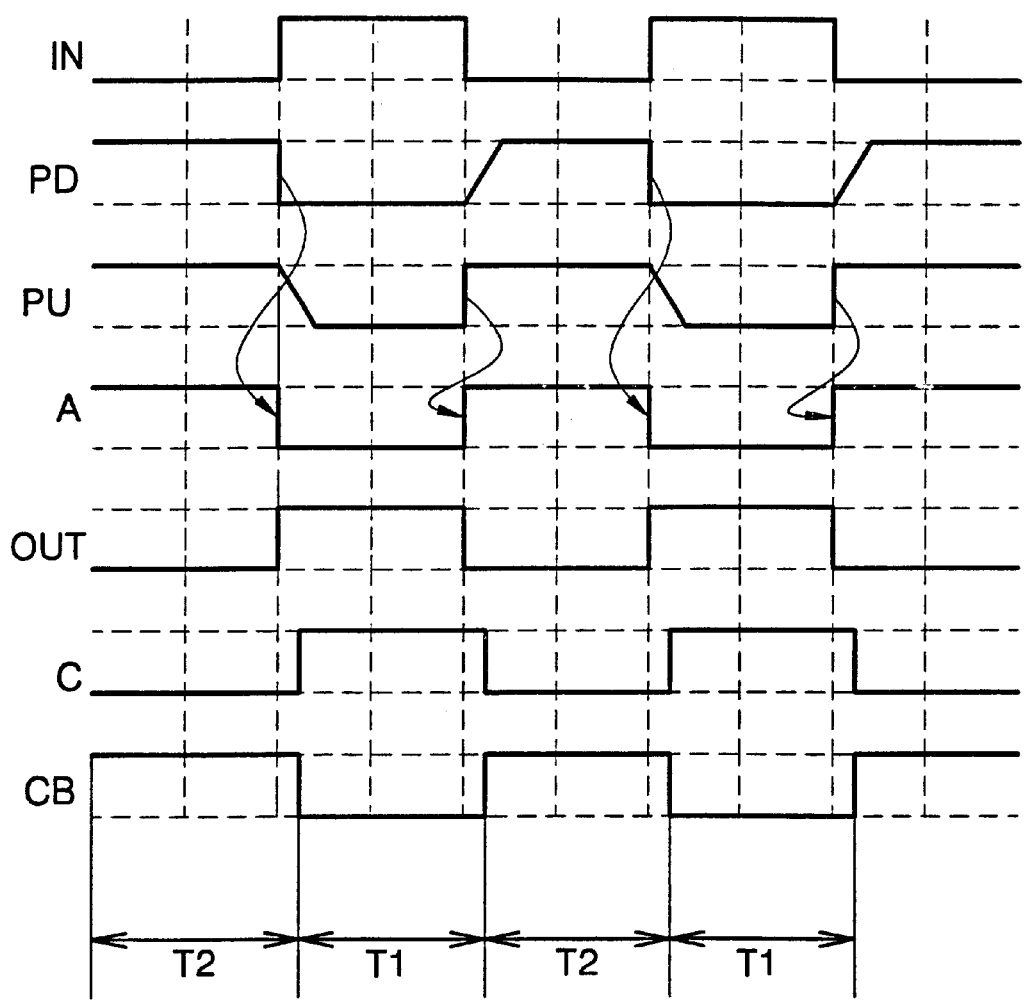
FIG. 10 is a timing diagram explaining operation of the circuit shown in FIG. 9, in accordance with the present invention.

FIG. 10 is a timing diagram for illustrating operation of the circuit shown in FIG. 9. When the output signal OUT is at a low level, the delay circuit 14 generates a control signal C at a low level after delaying the output signal OUT for a predetermined time period. The inverter 16 generates an inverted control signal CB at a high level. Accordingly, the CMOS transfer gate T1 is turned on. The fast pull-down circuit 20 generates a pull-down signal PD at a high level while the input signal IN is at a low level. When the input signal IN transitions to a high level, the NMOS transistor N6 is turned on so that the fast pull-down-circuit 20 generates a pull-down signal PD that transitions to a low level at a high speed. At the same time, the NMOS transistor SN4 is turned on so that the fast pull-up circuit 22 generates the pull-up signal PU that transitions to a low level at a relatively low speed. However, since the CMOS transfer gate T1 is turned on, and its counterpart gate T2 is turned off, only the pull-down signal PD of the fast pull-down circuit 20 is transferred as intermediate signal A. Therefore, the pull-down circuit 20 generates an intermediate signal A that transitions to a low level at a high speed, during the end of time interval T2.

When the output signal OUT is at a high level, the delay circuit 14 generates a control signal C at a high level after delaying the output signal OUT for a predetermined time period. The inverter 16 generates an inverted control signal CB at a low level. Accordingly, the CMOS transfer gate T2 is turned on. The fast pull-up circuit 22 generates a pull-up signal PU at a low level while the input signal IN is at a high level. When the input signal IN transitions to a low level, the PMOS transistor P6 is turned on so that the fast pull-up circuit 22 generates a pull-up signal PU that transitions to a high level at a high speed. At the same time, the PMOS transistor SP4 is turned on so that the fast pull-down circuit 20 generates a pull-down signal PD that transitions to a high level at a relatively low speed. However, since the CMOS transfer gate T2 is turned on, and its counterpart gate T1 is turned off, only the pull-up signal PU of the fast pull-up circuit 22 is transferred as intermediate signal A. Therefore, the pull-up circuit 22 generates the intermediate signal A that transitions to a high level at a high speed, during the end of time interval T1.

The buffer according to the present invention can transfer an input signal at a high speed in the case of a high-to-low transition of the input signal as well as a low-to-high transition of the input signal. Accordingly, a semiconductor memory device can be operated at a high speed by adopting the buffer according to the present invention.

While this invention has been particularly shown and described with references to preferred embodiments thereof, it will be understood by those skilled in the art that various changes in form and detail may be made herein without departing from the spirit and scope of the invention as defined by the appended claims.

What is claimed is:

1. A buffer, comprising:
   a pull-down means for generating an output signal that transitions to a first state when an input signal transitions from a first state to a second state in response to a control signal of a first control state;
   a pull-up means for generating said output signal that transitions to a second state when said input signal transitions from the second state to the first state in response to the control signal being of a second control state; and
   a control signal generator for generating said control signal in response to the output signal state;
   wherein said pull-down means comprises:
      a first pull-up transistor having a source to which a power supply is applied, and a gate to which said control signal is applied;
      a second pull-up transistor having a source which is connected to a drain of said first pull-up transistor, a gate to which said input signal is applied, and a drain which generates said output signal;
      a first pull-down transistor having a drain which is connected to the drain of said second pull-up transistor, and a gate to which said input signal is applied; and
      a second pull-down transistor having a drain which is connected to a source of said first pull-down transistor, a gate to which an inverted signal of said control signal is applied, and a source to which a ground voltage is applied, said second pull-up transistor being smaller than said first pull-up transistor and said first and second pull-down transistors.

2. The buffer as claimed in claim 1, wherein said pull-down means comprises:
   a fifth pull-up transistor having a source to which a power supply is applied, and a gate to which said input signal is applied;
   a fifth pull-down transistor having a drain which is connected to a drain of said fifth pull-up transistor, a gate to which said input signal is applied, and a source which is connected to a ground voltage; and
   a first CMOS transfer gate for transferring a signal output from the drain of said fifth pull-down transistor as said output signal in response to said control signal being in a first state, said fifth pull-up transistor being smaller than said fifth pull-down transistor.

3. The buffer as claimed in claim 1, wherein said control signal generator comprises:
   a first inverter for inverting the output signal of said pull-up or pull-down means;
   delay means for generating said control signal by delaying an output signal of said first inverter for a predetermined time duration; and
   a second inverter for generating said inverted control signal by inverting an output signal of said delay means.

4. A buffer, comprising:
   a pull-down means for pulling down an input signal, and for generating an output signal in response to a control signal and an inverted signal of said control signal;
   a pull-up means for pulling up said input signal and for generating said output signal in response to signals with an opposite phase of said control signal and the inverted signal of said control signal; and a control signal generator for generating said control signal and the inverted signal of said control signal in response to said output signal;

wherein said pull-down means comprises:

a first pull-up transistor having a source to which a power supply is applied, and a gate to which said control signal is applied;

a second pull-up transistor having a gate to which said input signal is applied, and a source which is connected to a drain of said first pull-up transistor, and a drain which generates said output signal;

a first pull-down transistor having a gate to which said input signal is applied, and the drain which is connected to a drain of said second pull-up transistor; and a second pull-down transistor having a gate to which the inverted signal of said control signal is applied, a drain which is connected to a source of said first pull-down transistor, and a source which is connected to a ground voltage, said second pull-up transistor being smaller than said first pull-up transistor and said first and second pull-down transistors.

5. The buffer as claimed in claim 4, wherein said pull-down means comprises:

a fifth pull-up transistor having a source to which a power supply is applied, and a gate to which said input signal is applied;

a fifth pull-down transistor having a drain which is connected to a drain of said fifth pull-up transistor, a gate to which said input signal is applied, and a source which is connected to a ground voltage; and a first CMOS transmission gate for transferring a signal output from the drain of said fifth pull-down transistor as said output signal in response to said control signal being in a first control state, said fifth pull-up transistor being smaller than said fifth pull-down transistor.

6. The buffer as claimed in claim 4, wherein said control signal generator comprises:

a first inverter for inverting said output signal of said pull-up or pull-down means;

a delay means for generating said control signal by delaying an output signal of said first inverter; and a second inverter for generating said inverted control signal by inverting an output signal of said delay means.

7. A buffer, comprising:

a pull-down means for outputting a pull-down signal which, in response to an input signal undergoing a transition from a low state to a high state, generates an output signal that is pulled down from a high state to a low state, and, in response to an input signal undergoing a transition from a high state to a low state, generates an output signal that is pulled up from a low state to a high state, the pull-down of the output signal occurring at a faster rate than the pull-up of the output signal, the pull-down means being activated in response to a control signal being in a first control state;

a pull-up means for outputting a pull-up signal which, in response to an input signal undergoing a transition from a low state to high state, generates an output signal that is pulled down from high state yo a low state, and, in response to an input signal undergoing a transition from a high state to a low state, generates an output signal that is pulled up from a low state to a high state, the pull-up of the output signal occuring at a faster rate than the pull-down of the output signal, the pull-up means being activated in response to the control signal being in a second control state; and a control signal generator for generating said control signal as a function of said output signal;

wherein said pull-down means comprises:

a first pull-up transistor having a source to which a power supply is applied, and a gate to which said control signal is applied;

a second pull-up transistor having a source which is connected to a drain of said first pull-up transistor, a gate to which said input signal is applied, and a drain which generates said output signal;

a first pull-down transistor having a drain which is connected to a drain of said second pull-up transistor, and a gate to which said input signal is applied; and a second pull-down transistor having a drain which is connected to a source of said first pull-down transistor, a gate to which an inverted signal of said control signal is applied, and a source to which the ground voltage is applied, said second pull-up transistor being smaller than said first pull-up transistor and said second pull-down transistors.

8. The buffer as claimed in claim 7, wherein said pull-down means comprises:

a fifth pull-up transistor having a source to which a power supply is applied, and a gate to which said input signal is applied;

a fifth pull-down transistor having a drain which is connected to a drain of said fifth pull-up transistor, a gate to which said input signal is applied, and a source which is connected to a ground voltage; and a first CMOS transfer gate for transferring a signal output from the drain of said fifth pull-down transistor as said output signal in response to said control signal being in the first control state, said fifth pull-up transistor being smaller than said fifth pull-down transistor.

9. The buffer as claimed in claim 7, wherein said control signal generator comprises:

a first inverter for inverting said output signal of said pull-up or pull-down means;

a delay means for generating said control signal by delaying an output signal of said first inverter for a predetermined time; and a second inverter for generating an inverted control signal by inverting an output signal of said delay means.

10. A buffer, comprising:

a pull-down means for generating an output signal that transitions to a first state when an input signal transitions from a first state to a second state in response to a control signal of a first control state;

a pull-up means for generating said output signal that transitions to a second state when said input signal transitions from the second state to the first state in response to the control signal being of a second control state; and a control signal generator for generating said control signal in response to the output signal state;

wherein said pull-up means comprises:

a first pull-up transistor having a gate to which the inverted signal of said control signal is applied, and a source to which a power supply is applied;

a second pull-up transistor having a source which is connected to the drain of said first pull-up transistor, a gate to which said input signal is applied, and a drain in which said output signal is generated;

a first pull-down transistor having a source which is connected to the drain of said second pull-up transistor, and a gate to which said input signal is applied; and a second pull-down transistor having a drain which is connected to the source of said first pull-down transistor, a gate to which said control signal is applied, and a source to which a ground voltage is applied, said first pull-down transistor being smaller than said first and second pull-up transistors and said second pull-down transistor.

11. The buffer as claimed in claim 10, wherein said pull-up means comprises:

a sixth pull-up transistor having a source to which a power supply is applied, and a gate to which said input signal is applied;

a sixth pull-down transistor having a drain which is connected to a drain of said sixth pull-up transistor, a gate to which said input signal is applied, and a source which is connected to a ground voltage; and a second CMOS transfer gate for transferring a signal output from the drain of said sixth pull-up transistor as said output signal in response to said control signal being in a second control state, said sixth pull-down transistor being smaller than said sixth pull-up transistor.

12. The buffer as claimed in claim 10, wherein said control signal generator comprises:

a first inverter for inverting the output signal of said pull-up or pull-down means;

a delay means for generating said control signal by delaying an output signal of said first inverter for a predetermined time duration; and a second inverter for generating said inverted control signal by inverting an output signal of said delay means.

13. A buffer, comprising:

a pull-down means for pulling down an input signal, and for generating an output signal in response to a control signal and an inverted signal of said control signal;

a pull-up means for pulling up said input signal and for generating said output signal in response to signals with an opposite phase of said control signal and the inverted signal of said control signal; and a control signal generator for generating said control signal and the inverted signal of said control signal in response to said output signal;

wherein said pull-up means comprises:

a first pull-up transistor having a source to which a power supply is applied, and a gate to which the inverted signal of said control signal is applied;

a second pull-up transistor having a source which is connected to a drain of said first pull-up transistor, and a gate to which said input signal is applied;

a first pull-down transistor having a drain which is connected to a drain of said second pull-up transistor, and a gate to which said input signal is applied; and a second pull-down transistor having a drain which is connected to a source of said first pull-down transistor, and a gate to which said control signal is applied, and a source which is connected to a ground voltage, said first pull-down transistor being smaller than said first and second pull-up transistors and said second pull-down transistor.

14. The buffer as claimed in claim 13, wherein said pull-up means comprises:

a sixth pull-up transistor having a source to which the power supply is applied, and a gate to which said input signal is applied;

a sixth pull-down transistor having a drain which is connected to a drain of said sixth pull-up transistor, a gate to which said input signal is applied, and a source which is connected to the ground voltage; and a second CMOS transmission gate for transferring a signal output from the drain of said sixth pull-up transistor as said output signal in response to said control signal of a second state, said sixth pull-down transistor being smaller than said sixth pull-up transistor.

15. The buffer as claimed in claim 13, wherein said control signal generator comprises:

a first inverter for inverting said output signal of said pull-up or pull-down means;

a delay means for generating said control signal by delaying an output signal of said first inverter; and a second inverter for generating said inverted control signal by inverting an output signal of said delay means.

16. A buffer, comprising:

a pull-down means for outputting a pull-down signal which, in response to an input signal undergoing a transition from a low state to a high state, generates an output signal that is pulled down from a high state to a low state, and, in response to an input signal undergoing a transition from a high state to a low state, generates an output signal that is pulled up from a low state to a high state, the pull-down of the output signal occurring at a faster rate than the pull-up of the output signal, the pull-down means being activated in response to a control signal being in a first control state;

a pull-up means for outputting a pull-up signal which, in response to an input signal undergoing a transition from a low state to a high state, generates an output signal that is pulled down from a high state to a low state, and, in response to an input signal undergoing a transition from a high state to a low state, generates an output signal that is pulled up from a low state to a high state, the pull-up of the output signal occurring at a faster rate than the pull-down of the output signal, the pull-up means being activated in response to the control signal being in a second control state; and a control signal generator for generating said control signal as a function of said output signal;

wherein said pull-up means comprises:

a first pull-up transistor having a gate to which an inverted signal of said control signal is applied, and a source to which a power supply is applied;

a second pull-up transistor having a source which is connected to the drain of said first pull-up transistor, a gate to which said input signal is applied, and a drain in which said output signal is generated;

a first pull-down transistor having a source which is connected to the drain of said second pull-up transistor, and a gate to which said input signal is applied; and a second pull-down transistor having a drain which is connected to the source of said first pull-down transistor, a gate to which said control signal is applied, and a source to which a ground voltage is applied, said first pull-down transistor being smaller than said first and second pull-up transistors and said second pull-down transistor.

17. The buffer as claimed in claim 16, wherein said pull-up means comprises:

a sixth pull-up transistor having a source to which a power supply is applied, and a gate to which said input signal is applied;

a sixth pull-down transistor having a drain which is connected to a drain of said sixth pull-up transistor, a gate to which said input signal is applied, and a source which is connected to a ground voltage; and a second CMOS transfer gate for transferring a signal output from the drain of said sixth pull-up transistor as said output signal in response to said control signal being in the second control state, said sixth pull-down transistor being smaller than said sixth pull-up transistor.

18. The buffer as claimed in claim 16, wherein said control signal generator comprises:

a first inverter for inverting said output signal of said pull-up or pull-down means;

a delay means for generating said control signal by delaying an output signal of said first inverter for a predetermined time; and a second inverter for generating an inverted control signal by inverting an output signal of said delay means.

* * * * *

UNITED STATES PATENT AND TRADEMARK OFFICE
CERTIFICATE OF CORRECTION

PATENT NO. : 6,351,148 B1  Page 1 of 1
DATED : February 26, 2002
INVENTOR(S) : Chan Yong Lee It is certified that error appears in the above-identified patent and that said Letters Patent is hereby corrected as shown below:

<u>Column 8,</u>
Line 55, insert -- a -- before "delay".

Signed and Sealed this

Twenty-fifth Day of June, 2002

Attest:

Attesting Officer

JAMES E. ROGAN
*Director of the United States Patent and Trademark Office*